United States Patent
Moon et al.

(10) Patent No.: US 8,289,791 B2
(45) Date of Patent: Oct. 16, 2012

(54) TEST METHOD AND DEVICE FOR MEMORY DEVICE

(75) Inventors: SeongHwan Moon, Suwon-si (KR); Chul-Hoon Byun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 365 days.

(21) Appl. No.: 12/662,270

(22) Filed: Apr. 8, 2010

(65) Prior Publication Data

US 2011/0032782 A1 Feb. 10, 2011

(30) Foreign Application Priority Data

Aug. 6, 2009 (KR) .................. 10-2009-0072531

(51) Int. Cl.
*G11C 29/00* (2006.01)
(52) U.S. Cl. .................. 365/201; 365/226; 323/266
(58) Field of Classification Search .................. 365/200, 365/201, 226, 227; 323/266, 270, 282, 283, 323/285, 326
See application file for complete search history.

(56) References Cited

U.S. PATENT DOCUMENTS

| | | | | |
|---|---|---|---|---|
| 5,105,182 A | * | 4/1992 | Shindo | 340/663 |
| 6,005,373 A | * | 12/1999 | Snodgrass et al. | 323/266 |
| 7,002,266 B1 | * | 2/2006 | Adkins et al. | 307/151 |
| 7,210,159 B2 | * | 4/2007 | Roop et al. | 725/54 |
| 7,683,596 B1 | * | 3/2010 | Kaplish | 323/283 |
| 8,058,748 B2 | * | 11/2011 | Kohnotoh et al. | 307/43 |

FOREIGN PATENT DOCUMENTS

| | | |
|---|---|---|
| JP | 2007-241618 | 9/2007 |
| JP | 2008-305500 | 12/2008 |
| KR | 10-0401515 | 9/2003 |

* cited by examiner

*Primary Examiner* — Gene Auduong
(74) *Attorney, Agent, or Firm* — Harness, Dickey & Pierce

(57) ABSTRACT

Provided is a test method for a memory device including a plurality of storage regions and an SPO recovery unit. The test method stores data in the plurality of storage regions. The test method shuts off supply of power to the memory device and resupplies the power to the memory device. The test method determines an operational state of the SPO recovery unit after the resupplying step based on the stored data.

19 Claims, 10 Drawing Sheets

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 1 | 1 | 1 | 1 | 1 | 1 | 1 | 1 |
| Pattern | 2 | 2 | 2 | SP0 |   |   |   |   |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 2 | 2 | 2 | 1 | 1 | 1 | 1 | 1 |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 1     | 1     | 1     | 1     | 1     | 1     | 1     | 1     |
| Pattern | 2     | 2     | 2     | SP0   |       |       |       |       |
| Pattern | 3     | SP0   |       |       |       |       |       |       |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 3     | 1     | 2     | 1     | 1     | 1     | 1     | 1     |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 10    | 10    | 10    | 10    | 10    | 10    | 10    | 10    |
| Pattern | 9     | 9     | 9     | 9     | 9     | SP0   |       |       |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 9     | 9     | 9     | 9     | 9     | 10    | 10    | 10    |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 10    | 10    | 10    | 10    | 10    | 10    | 10    | 10    |
| Pattern | 9     | 9     | 9     | 9     | 9     | SP0   |       |       |
| Pattern | 8     | 8     | 8     | SP0   |       |       |       |       |

| Sector  | $S_1$ | $S_2$ | $S_3$ | $S_4$ | $S_5$ | $S_6$ | $S_7$ | $S_8$ |
|---------|-------|-------|-------|-------|-------|-------|-------|-------|
| Pattern | 8     | 8     | 8     | 10    | 9     | 10    | 10    | 10    |

| $S_1$ | $S_2$ | $S_3$ | $S_4$ | $S_5$ | $S_6$ | $S_7$ | $S_8$ |
|---|---|---|---|---|---|---|---|
| 2 | 3 | 4 | 5 | 6 | 7 | 8 | 9 |
| 3 | 4 | 5 | 6 | 7 | 8 | 9 | 10 |
| ⋮ | ⋮ | ⋮ | ⋮ | ⋮ | ⋮ | ⋮ | ⋮ |
| 128 | 129 | 130 | 131 | 132 | 133 | 134 | 135 |
| 129 | 130 | 131 | 132 | 133 | 134 | 135 | 136 |

TEST METHOD AND DEVICE FOR MEMORY DEVICE

CROSS-REFERENCE TO RELATED APPLICATIONS

This U.S. non-provisional patent application claims priority under 35 U.S.C. §119 to Korean Patent Application No. 10-2009-0072531, filed on Aug. 6, 2009, in the Korean Intellectual Property Office (KIPO), the entire contents of which is incorporated herein by reference.

BACKGROUND

1. Field

Example embodiments relate to a test method and device for memory device, and more particularly, to a test method and device for memory device, which may have a Sudden Power Off (SPO) recovery function.

2. Description of the Related Art

Recently, more memory systems including a semiconductor memory device are being used. The semiconductor memory device is a storage device that may store data and may read out the stored data if necessary. The semiconductor memory device may be divided into a volatile memory device and a nonvolatile memory device.

If the semiconductor memory device is recording data in a nonvolatile memory device, inaccurate data may be left in a nonvolatile memory if SPO occurs. For securing the accuracy of data, the nonvolatile memory device may delete inaccurate data in the nonvolatile memory and may recover pre-written data.

The operation of securing the accuracy of the data in the nonvolatile memory device is called an SPO recovery operation. The nonvolatile memory device may also include software for performing the SPO recovery operation.

SUMMARY

Example embodiments provide a test method and device, which may efficiently determine whether the SPO recovery operation of a memory device is successful.

Embodiments of the inventive concepts provide a test method for a memory device including a plurality of storage regions and a Sudden Power Off (SPO) recovery unit may include storing data in the plurality of storage regions. The test method may shutting off supply of power to the memory device and resupply the power supply to the memory device. The test method may determine an operational state of the SPO recovery unit after the resupplying step based on the stored data.

In some embodiments, the storing of data may include: sequentially storing a first data in first and second storage regions of the plurality of storage regions; and sequentially overwriting a second data, which differs from the first data, in the first and second storage regions.

In other embodiments, the second data may be greater than the first data.

In still other embodiments, the determining of the operational state of the SPO recovery unit may determine the SPO recovery operational state is unsuccessful, if data stored in the second storage region is greater than data which is stored in the first storage region.

In even other embodiments, the second data may be less than the first data.

In yet other embodiments, the determining of the operational state of the SPO recovery unit may determine the SPO recovery operational state unsuccessful, if data stored in the second storage region is less than data which is stored in the first storage region.

In other embodiments of the inventive concepts, a test device for a memory device including a plurality of storage regions and a Sudden Power Off (SPO) recovery unit may include a data generator configured to generate data. The test device may have a switch configured to selectively supply power to the memory device. The test device for the memory device may also include a possessor configured to store data in the plurality of storage regions, shut off supply of power to the memory device, resupply the power to the memory device. The processor of the memory device is also configured to determine an operational state of the SPO recovery unit after the resupply of power on the stored data. In some embodiments, the data generator may be configured to generate a first data and a second data which differs from the first data, wherein the first data may be sequentially storing in first and second storage regions of the plurality of storage regions, and the second data may be sequentially overwritten in the first and second storage regions.

In other embodiments, the second data may be greater than the first data.

In still other embodiments, the processor may be configured to determine the operational state of the SPO recovery unit as being unsuccessful, if data stored in the second storage region is greater than data which is stored in the first storage region.

In even other embodiments, the second data may be less than the first data.

In yet other embodiments, the processor may be configured to determine the operational state of the SPO recovery unit as being unsuccessful, if data stored in the second storage region is less than data which is stored in the first storage region.

In other example embodiments, the test method for the memory device including a plurality of storage regions and a data recovery unit may include determining an operating state of the data recovery unit after a sudden power off of power supplied to the memory device based on the data stored in the plurality of storage regions.

BRIEF DESCRIPTION OF THE DRAWINGS

The accompanying drawings are included to provide a further understanding of example embodiments of inventive concepts, and are incorporated in and constitute a part of this specification. The drawings illustrate exemplary embodiments of the inventive concepts and, together with the description, serve to explain, principles of the embodiments. In the drawings.

DETAILED DESCRIPTION

Figure 1:
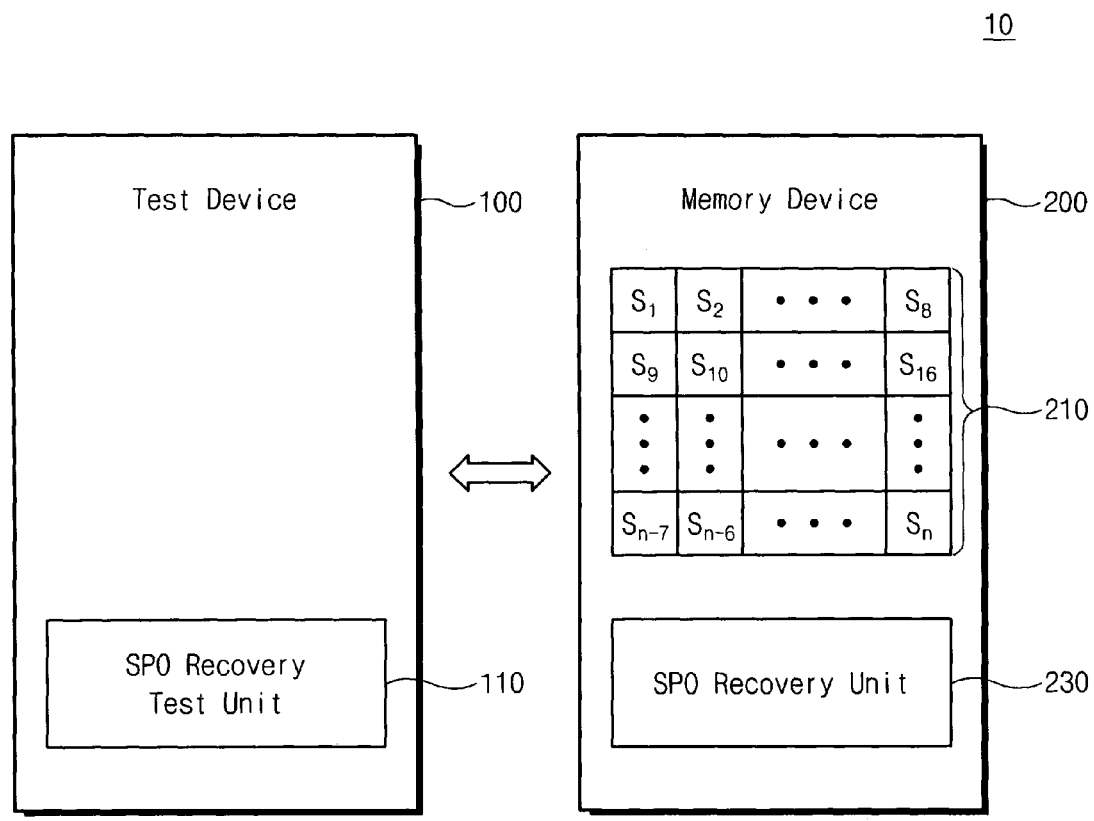
FIG. 1 is a block diagram illustrating a test system according to an example embodiment of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a test system 10 according to an example embodiment of the inventive concepts.

Referring to FIG. 1, a test system 10 according to an example embodiment of the inventive concepts includes a test device 100 and a memory device 200.

The test device 100 according to an embodiment of the inventive concepts determines if an operational state the memory device 200 is defective. For example, the test device 100 may determine if the memory device 200 is a functioning product or a defective product before the memory device 200 is commercialized. For example, the test device 100 may perform a test operation determining the operational state of the SPO recovery unit. For example, the test device 100 may determine an operational state of the memory device 200 is unsuccessful through a memory burn-in test method. In another example, moreover, it can be understood that the test device 100 may determine whether a memory device under use is a functioning or defective product.

The test device 100 includes a Sudden Power Off (SPO) recovery test unit 110. The SPO recovery test unit 110 may test the performance of a SPO recovery unit 210 of the memory device 200. In an example embodiment, the SPO recovery test unit 110 may determine an operational state of the SPO recovery unit 230 based on pattern data that may be stored in the memory sector of the memory device 200.

The memory device 200 may include a memory cell array 210. The memory cell array 210 may include a plurality of sectors. Each of the sectors may include a plurality of memory cells, and each of the memory cells may store one or more bits in each cell. In an example embodiment, each sector stores pattern data. Moreover, each sector may include a plurality of blocks. Each of the blocks may store the pattern data through a desired or alternatively predetermined method, for stably storing the pattern data. This will be described below in more detail with reference to FIG. 18.

In example embodiments, the test device 100 may cause a Sudden Power Off (SPO) while sequentially increasing pattern data is being stored in the plurality of memory sectors. In an example embodiment, the SPO recovery test unit 110 determine the operational state of the SPO recovery unit 230 based on pattern data that are stored in recovered memory sectors. If pattern data stored in a sector of a higher sector number is greater than pattern data that is stored in a sector of a lower sector number, then determining the operation state of the SPO recovery unit 230 may determine the memory device to be a defective product. This will be described below in more detail with reference to FIGS. 3 through 9.

In another example, the test device 100 may cause SPO while a sequentially-decreased pattern data are being stored in memory sectors. In this case, the SPO recovery test unit 110 determines whether an operational state of the SPO recovery unit 230 is successful based on pattern data that are stored in recovered memory sectors. If pattern data stored in a higher sector number is less than pattern data stored in a lower sector number, the SPO recovery test unit 110 determines the operational state of the SPO recovery unit 230 based on the stored data. This will be described below in more detail with reference to FIGS. 10 through 16.

The memory device 200 may include a nonvolatile memory. In an example embodiment, the memory device 200 may include a nonvolatile memory such as flash memory, Ferroelectric Random Access Memory (FRAM), Magnetoresistive Random Access Memory (MRAM), Phase-change Random Access Memory (PRAM) or Resistive Random Access Memory (RRAM).

Referring to FIG. 1, the memory device 200 includes a SPO recovery unit 230. The SPO recovery unit 230 recovers previously stored data in the memory cell array 210. The SPO recovery unit 230 denotes all units including software that performs a SPO recovery operation. In an example embodiment, the SPO recovery unit 230 includes a well-known structure such as a flash translation layer.

In an example embodiment, if the SPO occurs while writing data in the memory cell array 210, incomplete data may be programmed and left in the memory cell array 210. In this case, the SPO recovery unit 230 deletes the incomplete data. Moreover, the SPO recovery unit 230 recovers data that was stored in the memory cell array 210 before writing the incomplete data.

In another example embodiment, the SPO recovery unit 230 may recover a mapping table that is stored in a flash translation layer.

In another example embodiment, if SPO occurs while programming a Most Significant Bit data (MSB) in a Multi Level Cell (MLC), an incomplete MSB may be programmed in the memory cell array 210. Furthermore, a pre-programmed Least Significant Bit data (LSB) may be changed by the programming operation of the MSB. Accordingly, if a power supply source is restored, the SPO recovery unit 230 deletes the programmed incomplete MSB data and recovers a LSB.

As described above, the SPO recovery unit 230 performs a desired or important function in terms of reliability for data that are stored in the memory device 200. In an example embodiment, the memory device 200 may use a flash memory as a storage device, and users may frequently turn off the power supply source of a memory device. If the SPO recovery unit 230 does not reliably or accurately operate, data containing errors may be stored in the flash memory. Accordingly, the performance of the SPO recovery unit 230 may be verified for improving reliability of the memory device 200.

In an example embodiment of the inventive concepts, the test device 100 includes the SPO recovery test unit 110 for efficiently the performance of the SPO recovery unit 230. Hereinafter, the SPO recovery test unit 110 according to an example embodiment of the inventive concepts will be described in more detail.

Figure 2:
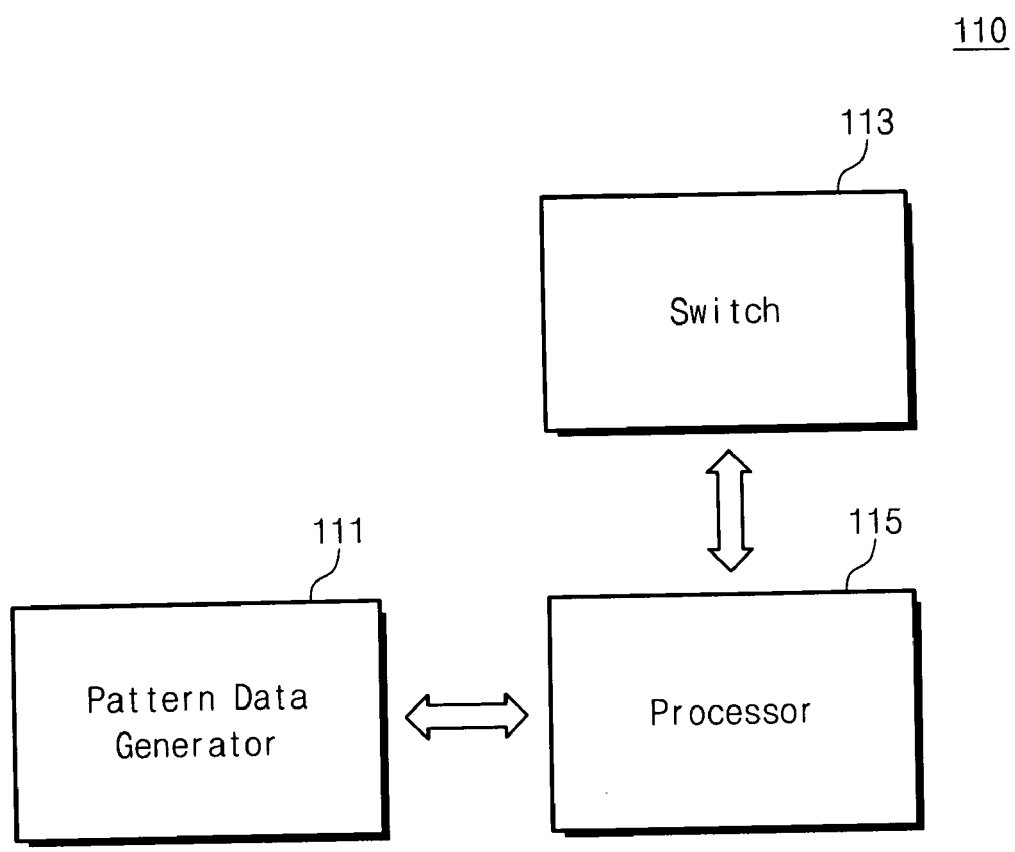
FIG. 2 is a block diagram illustrating a Sudden Power Off (SPO) recovery test unit in FIG. 1.

FIG. 2 is a block diagram illustrating in more detail the SPO recovery test unit 110 in FIG. 1.

Referring to FIG. 2, the SPO recovery test unit 110 may include a pattern data generator 111, a switch 113, and a processor 115.

The pattern data generator 111 may generate pattern data according to a control of the processor 115. For example, the pattern data generator 111 may generate a sequentially increasing pattern data "1, 2, 3, 4, . . . ". In another example embodiment, the pattern data generator 111 may generate sequentially decreasing pattern data "10, 9, 8, 7, . . . ".

The switch 113 causes SPO according to the control of the processor 115. In an example embodiment, the switch 113 may be turned off while pattern data are being written in the plurality of sectors of the memory cell array 210. In an example embodiment, a power supply source supplying power to the memory device 200 may be turned off. Subsequently, the processor 115 may turn on the switch 113. In this example embodiment, the power supply source may resupply the power to the memory device 200. The switch 113 may be a switch device such as MOS transistor or Bipolar Junction Transistor (BJT).

The processor 115 controls a test operation based on a desired or predetermined sequence. The test operation may test the performance of the SPO recovery unit 230. In an example embodiment, the processor 115 is configured to control the pattern data generator 111 to generate pattern data. Subsequently, the processor 115 transfers a command for writing the generated pattern data in the memory sectors of the memory cell array 210, to the memory device 200. The processor 115 is configured to control the switch 113 to shut off a power supply source supplying the power to the memory device 200. The processor 115 controls the switch 113 to resupply the to the memory device 200. The processor 115 tests the performance of the SPO recovery unit 230 based on the pattern data that are stored in the plurality of memory sectors.

Hereinafter, the operation of the SPO recovery test unit 110 according to an example embodiment of the inventive concepts will be described in more detail. Specifically, using sequentially increasing pattern data, a method for verifying an SPO recovery operation will be described with reference to FIGS. 3 through 9. By using sequentially increasing pattern data, a method for verifying an SPO recovery operation will be described with reference to FIGS. 10 through 16.

Figures 3, 4, 5:
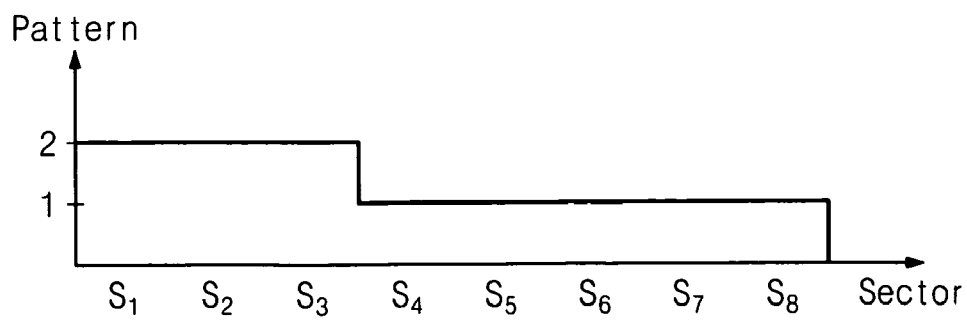
FIG. 3 is a table showing pattern data which may be stored in sectors, according to an example embodiment of the inventive concepts.
FIG. 4 is a table showing pattern data which may be detected when an SPO recovery operation is successful, according to an example embodiment
FIG. 5 is a graph showing pattern data which may be detected when an SPO recovery operation is successful, according to an example embodiment of the inventive concepts.
Figures 6, 7, 8:
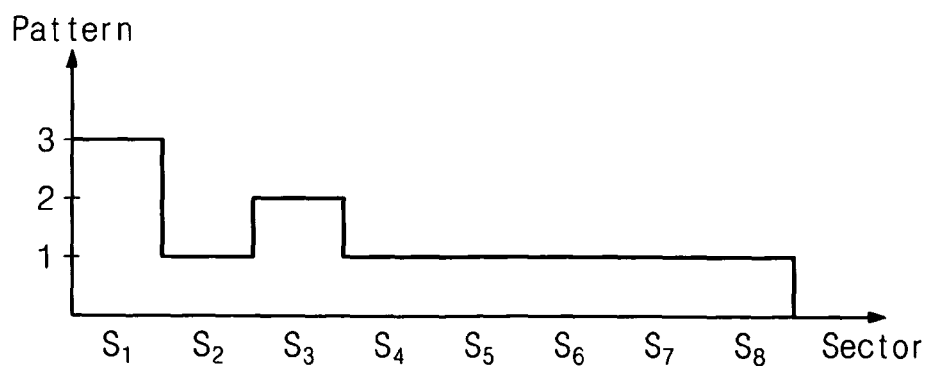
FIG. 6 is a table showing pattern data which may be stored in sectors, according to an example embodiment of the inventive concepts.
FIG. 7 is a table showing pattern data which may be detected when an SPO recovery operation is unsuccessful, according to an example embodiment of the inventive concepts.
FIG. 8 is a graph showing pattern data which may be detected when an SPO recovery operation is unsuccessful, according to an example embodiment of the inventive concepts.

FIGS. 3 through 8 illustrate a method for verifying an SPO recovery operation by using sequentially increasing pattern data. Specifically, FIGS. 3 through 5 illustrate an embodiment in which the determining an operational state of the SPO recovery unit 230 after the resupply of power determines the operational state of the SPO recovery unit 230 is successful. FIGS. 6 through 8 illustrate an embodiment in which the determining an operational state of the SPO recovery unit 230 after the resupply of power determines the operational state according to an embodiment of the inventive concepts is unsuccessful. Hereinafter, an example embodiment in which the determining an operational state of the SPO recovery unit 230 is unsuccessful will be described with reference to FIGS. 3 through 5. Then, a case in which the determining an operational state of the SPO recovery unit 230 is unsuccessful will be described with reference to FIGS. 6 through 8.

FIG. 3 is a table showing pattern data which are stored in the plurality of sectors, according to an example embodiment of the inventive concepts. FIG. 4 is a table showing pattern data which may be detected when an operational state of the SPO recovery unit 230 is successful, according to an embodiment of the inventive concepts. FIG. 5 is a graph showing pattern data which are detected when an operational state of the SPO recovery unit 230 is successful, according to an example embodiments. Herein, the abscissa axis indicates each sector, and the ordinate axis indicates pattern data which are stored in respective sectors.

It may be assumed that pattern data has positive integer values. Also, it may be assumed that pattern data is sequentially stored in a first to an eighth sectors S1 to S8. Moreover, it may be assumed that SPO occurs while pattern data '2' is being written in the fourth sector S4.

Referring to FIGS. 1 through 3, a sequentially increasing data pattern are generated in the pattern data generator 111. The generated data pattern are stored in the sectors of the memory cell array 210 according to the control of the processor 115.

First, pattern data bit '1' is generated in the pattern data generator 111. The generated pattern data '1' is sequentially stored in the first to the eighth sectors S1 to S8. Subsequently, pattern data '2' is generated in the pattern data generator 111. The generated pattern data '2' is sequentially stored in the first to eighth sectors S1 to S8.

For testing the recovery performance of the SPO recovery unit 230, the processor 115 may control the switch 113 to cause SPO. The switch 113 shuts off the supply of power to the memory device 200 while the pattern data '2' is being sequentially stored in the first to the eighth sectors S1 to S8. Referring to FIG. 3, the power supply to the memory device 200 is shut off while the pattern data '2' is being sequentially stored in the fourth sector S4.

Subsequently, the processor 115 controls the switch 113 to resupply the power to the memory device 200. In this example embodiment, the SPO recovery unit 230 performs a SPO recovery operation. For example, if SPO occurs while the pattern data '2' is being written in the fourth sector S4, data stored in the fourth sector S4 may be another data instead of the pattern data '2'. In this example embodiment, the SPO recovery unit 230 deletes the incorrectly written pattern data '2' and recovers the previously stored pattern data '1'.

Accordingly, if the SPO recovery operation of the SPO recovery unit 230 is successful, the pattern data '2' is stored in the first to third sectors S1 to S3, and the pattern data '1' is stored in the fourth to eighth sectors S4 to S8. This is shown in FIGS. 4 and 5.

Referring to FIGS. 4 and 5, if an SPO recovery operation is successively performed by the SPO recovery unit 230, the pattern data that is stored in a higher sector number is equal to or less than pattern data that is stored a lower sector number. Therefore, the SPO recovery test unit 110 may verify whether the operational state of the SPO recovery unit 230 is successful based on the pattern data that may be stored in the first to the eighth sectors S1 to S8.

If pattern data that is stored in a higher sector number is greater than pattern data that is stored a lower sector number, the operational state of the SPO recovery unit 230 is determined as unsuccessful. This will be described below in more detail with reference to FIGS. 6 through 8.

FIG. 6 is a table showing pattern data which may be stored in sectors, according to an example embodiment of the inventive concepts. FIG. 7 is a table showing pattern data which are detected if an SPO recovery operation is successful, according to an example embodiment of the inventive concepts. FIG. 8 is a graph showing pattern data which are detected if an SPO recovery operation is unsuccessful, according to an example embodiment of the inventive concepts. Herein, the abscissa axis indicates each sector, and the ordinate axis indicates pattern data which are stored in respective sectors.

It may be assumed that pattern data has a positive integer value. It may be assumed that pattern data is sequentially stored in a first to an eighth sector S1 to S8. Moreover, it may be assumed that SPO occurs while pattern data '2' is being written in the fourth sector S4, and SPO occurs while pattern data '3' is being written in the second sector S2.

Referring to FIGS. 1, 2 and 6, first; pattern data '1' is generated in the pattern data generator 111. The generated pattern data '1' is sequentially stored in the a first to an eighth sector S1 to S8. Subsequently, pattern data '2' is generated in the pattern data generator 111. The generated pattern data '2' is sequentially overwritten in the first to the eighth sectors S1 to S8.

If SPO occurs while writing pattern data '2' in the fourth sector S4, the SPO recovery unit 230 performs a SPO recovery operation. Subsequently, the SPO recovery test unit 110 tests whether the SPO recovery operation is successfully. This has been described above with reference to FIG. 3, and thus its detailed description will be omitted. For conciseness, it may be assumed that the operational state of the SPO recovery unit 230 is successful.

If the operational state of the SPO recovery unit 230 is determined as being successful, pattern data '3' is sequentially written in the first to the eighth sectors S1 to S8. Subsequently, the occurrence of SPO and a determination of the operational state of the SPO recovery unit 230 may be repeated. Referring continuously to FIG. 6, it may be assumed that SPO may occur while the pattern data '3' is being written in the second sector S2.

If a power supply source is resupplied after the occurrence of SPO, the SPO recovery unit 230 perform a SPO recovery operation. The SPO recovery test unit 110 may determine whether the operational state of the SPO recovery unit 230 is successful based on pattern data that are stored in the first to the eighth sectors S1 to S8. If a SPO recovery operational state of the SPO recovery unit 230 is successful, pattern data that is stored in a higher sector number is equal to or greater than pattern data that is stored in a lower sector number. On the other hand, if an operational state of the SPO recovery unit 230 is unsuccessful, pattern data that are stored in a higher sector number may be less than pattern data that is stored in a lower sector number. This has been described above in detail with reference to FIG. 3, and thus its detailed description will be omitted.

Referring to FIGS. 7 and 8, the SPO recovery result of the SPO recovery unit 230 according to an example embodiment of the inventive concepts is shown. In this example embodiment, the SPO recovery test unit 110 determines the operational state of the SPO recovery unit 230 is unsuccessful based on the pattern data stored in the third sector S3 being greater than pattern data that is stored in the second sector S2.

If SPO occurs while pattern data '3' is being written, the SPO recovery unit 230 deletes an error in the data that is stored in a sector where SPO occurs. The SPO recovery unit 230 also recovers the pattern data '2' that was previously written. Accordingly, when the SPO recovery unit 230 successively performs an SPO recovery operation, pattern data that are stored in the first to the eighth sectors S1 to S8 becomes "3, 2, 2, 1, 1, 1, 1, 1".

Referring continuously to FIGS. 7 and 8, pattern data stored in the third sector S3 is greater than pattern data that is stored in the second sector S2. This is because the SPO recovery unit 230 recovers error data '1' in an SPO recovery operation. In this example embodiment, the SPO recovery test unit 110 determines the operational state of the SPO recovery unit 230 is unsuccessful A method in which the SPO recovery test unit 110 determines an operational state of the SPO recovery unit 230 is unsuccessful may be understood by an example embodiment. For example, the SPO recovery test unit 110 determines operational state of the SPO recovery unit is unsuccessful even if it is impossible to analyze pattern data that are in a memory sector. In another example embodiment, the SPO recovery test unit 110 determines operational state of the SPO recovery unit 230 is unsuccessful even if data stored in the memory sector are initialized.

Figure 9:
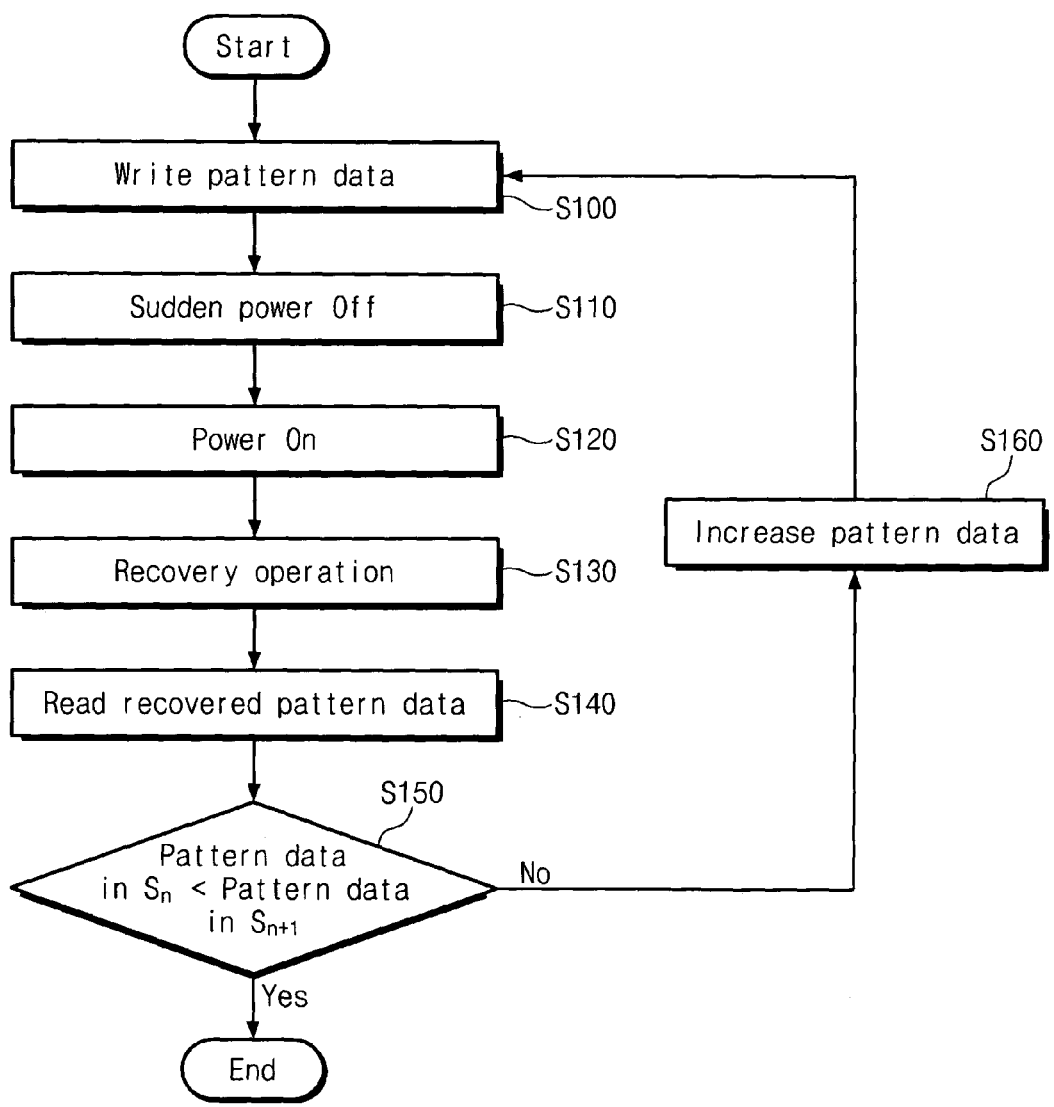
FIG. 9 is a flow chart illustrating a method for verifying the SPO recovery operation of an SPO recovery unit in FIGS. 3 through 8.

FIG. 9 is a flow chart illustrating a method for verifying the SPO recovery operation of the SPO recovery unit 230 in FIGS. 3 through 8.

In operation S100, an operation is performed for writing pattern data in desired or predetermined sectors. Referring to FIGS. 2 and 3, for example, pattern data '1' is generated in the pattern data generator 111. The generated pattern data '1' is sequentially written in the first to the eighth sectors S1 to S8 according to the control of the processor 115. Subsequently, pattern data '2' is generated in the pattern data generator 111. The generated pattern data '2' is sequentially written in the first to the eighth sectors S1 to S8 according to the control of the processor 115.

In operation S110, SPO occurs. Referring to FIGS. 2 and 3, for example, the processor 115 controls the switch 113 to shut off a power supply source which is supplying the power to the memory device 200 while the pattern data '2' is being written in the first to eighth sectors S1 to S8.

In operation S120, the power supply source is resupplied. Referring to FIGS. 1 through 3, for example, the processor 115 controls the switch 113 to turn on the power supply source to supply the power to the memory device 200.

In operation S130, an SPO recovery operation may be performed. Referring to FIGS. 1 through 3, for example, if SPO occurs while writing pattern data '2', the SPO recovery unit 230 deletes the pattern data '2' that is incorrectly stored. Moreover, the SPO recovery unit 230 recovers the pattern data '1' that was previously written.

In operation S140, the SPO recovery test unit 110 reads the pattern data that is recovered through operation S130. Referring to FIGS. 1 through 3, for example, the processor 115 transfers a pattern data reading command PDR_CMD (not shown) for reading pattern data that are stored in the first to the eighth sectors S1 to S8. The memory device 200 transfers the pattern data, which are stored in the first to the eighth sectors S1 to S8 and recovered, to the processor 115 in response to the pattern data reading command PDR_CMD.

In operation S150, it may be determined that pattern data stored in a higher sector number is greater than pattern data that is stored in a lower sector number. If the pattern data stored in the higher sector number is greater than the pattern data that is stored in the lower sector number, the operational state of the SPO recovery unit 230 may be determined as being unsuccessful.

Referring to FIG. 4, for example, since pattern data stored in the third sector S3 is greater than pattern data that is stored in the second sector S2, the SPO recovery operation of the SPO recovery unit 230 is determined as being unsuccessful. As another example embodiment, even if it is impossible to analyze pattern data that is stored in the memory sector, the SPO recovery unit 110 determines that operational state of the SPO unit 230 as being unsuccessful. As another example embodiment, even if data stored in the memory sector are initialized, the SPO recovery test unit 110 determines that operational state of the SPO unit 230 as being unsuccessful.

If the pattern data stored in a higher sector number is greater than the pattern data that is stored in a lower sector number, the operational state of the SPO recovery unit 230 is determined as being unsuccessful. Referring to FIG. 4, for example, since pattern data stored in the third sector S3 is greater than pattern data that is stored in the second sector S2, the operational state of the SPO recovery unit 230 is determined as being unsuccessful.

If the operational state of the SPO recovery unit 230 is determined as being successful, pattern data may be increased in operation S160. Subsequently, for the increased pattern data, the above-described verification operation may be repeated by a certain number of times.

The number of times the verification operation is repeated may be different for each manufacturer. If the number of times the verification operation is repeated increases, the reliability of the SPO recovery unit may 230 improve.

Figures 10, 11, 12:
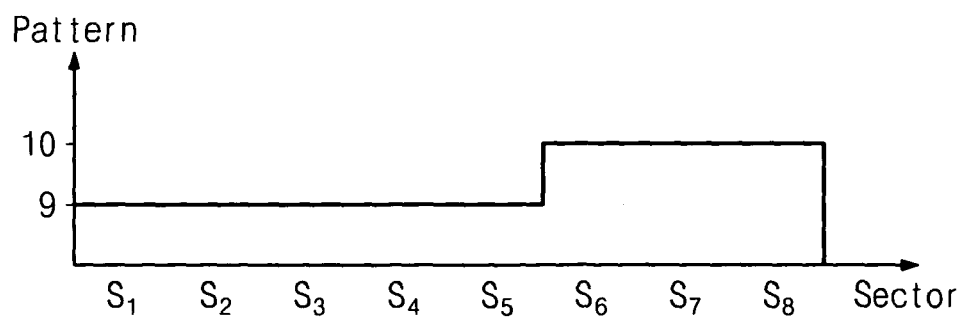
FIG. 10 is a table showing pattern data which may be stored in sectors, according to another example embodiment of the inventive concepts.
FIG. 11 is a table showing pattern data which may be detected when an SPO recovery operation is successful, according to another example embodiment of the inventive concepts.
FIG. 12 is a graph showing pattern data which may be detected when an SPO recovery operation is successful, according to another example embodiment of the inventive concepts.
Figures 13, 14, 15:
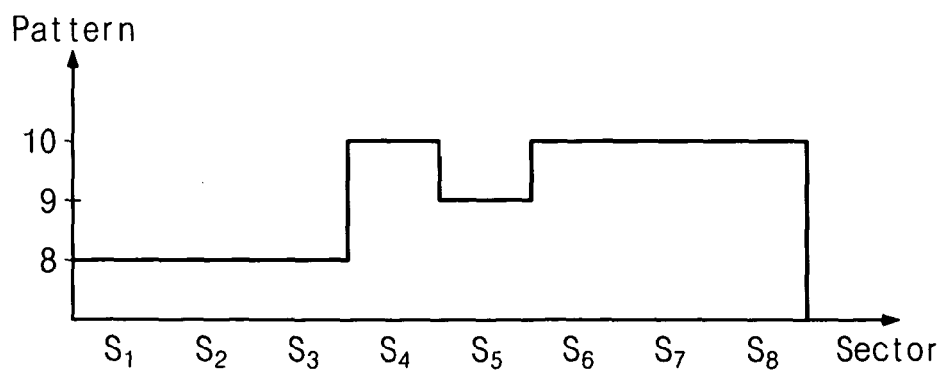
FIG. 13 is a table showing pattern data which may be stored in sectors, according to another example embodiment of the inventive concepts.
FIG. 14 is a table showing pattern data which may be detected when an SPO recovery operation is unsuccessful, according to another example embodiment of the inventive concepts.
FIG. 15 is a graph showing pattern data which may be detected when an SPO recovery operation is unsuccessful, according to another example embodiment of the inventive concepts.

FIGS. 10 through 15 illustrate a method for verifying the operational state of the SPO recovery unit 230 by using pattern data which Are sequentially decreased. Specifically, FIGS. 10 through 12 illustrate an example embodiment in which the SPO recovery operation of the SPO recovery unit 230 is successfully performed. FIGS. 13 through 15 illustrate an example embodiment in which the SPO recovery operation of the SPO recovery unit 230 is unsuccessful. Hereinafter, an example embodiment in which the SPO recovery operation is successful will first be described. Then, an embodiment in which the SPO recovery operation is unsuccessful will be described.

FIG. 10 is a table showing pattern data which are stored in sectors, according to an example embodiment. FIG. 11 is a table showing pattern data which are detected when an SPO recovery operation is successful, according to another example embodiment. FIG. 12 is a graph showing pattern data which are detected when an SPO recovery operation is successful, according to another example embodiment of the inventive concepts. Herein, the abscissa axis indicates each sector, and the ordinate axis indicates pattern data which are stored in respective sectors.

It may be assumed that pattern data have positive integer values. It may be assumed that generated pattern data are sequentially stored in first to eighth sectors S1 to S8. Moreover, it may be assumed that SPO occurs while pattern data '10' is being written in the sixth sector S6.

Referring to FIGS. 1, 2 and 10, sequentially decreasing pattern data are generated in the pattern data generator 111. The generated pattern data are sequentially stored in the plurality of sectors. For example, pattern data '10' is sequentially stored in the first to eighth sectors S1 to S8. Subsequently, pattern data '9' is sequentially stored in the first to eighth sectors S1 to S8.

The SPO recovery test unit 110 causes SPO while pattern data are being written. Referring continuously to FIG. 10, for example, SPO occurs while pattern data '9' is being written in the sixth sector S6. Subsequently, the SPO recovery test unit 110 resupplies a power supply source to the memory device 200. In this example embodiment, the SPO recovery test unit 110 has been described above with reference to FIG. 3, and thus its detailed description will be omitted.

If the power supply source resupplied to the memory device 200, the SPO recovery unit 230 performs a SPO recovery operation. For example, when SPO occurs while the pattern data '9' is being written in the sixth sector S6, the SPO recovery unit 230 deletes the pattern data '9' that is incorrectly written and the SP recovery unit 230 recovers the pattern data '10' that was previously stored.

If the SPO recovery operation is successfully performed, pattern data stored in a higher sector number is equal to or greater than pattern data that are stored in a lower sector number. Referring to FIGS. 11 and 12, for example, the pattern data '9' is stored in the first to fifth sectors S1 to S5. The pattern data '10' is stored in the sixth to eighth sectors S6 to S8.

In this example embodiment, the SPO recovery test unit 110 determines the SPO recovery operation of the SPO recovery unit 230 as being successful. This is because pattern data stored in the fifth sector S5 is less than pattern data that is stored in the sixth sector S6. This is similar to the described in FIG. 3, and thus its detailed description will be omitted.

However, when the pattern data stored in a higher sector number is less than the pattern data that is stored in a lower sector number, the SPO recovery test unit 110 determines the operational state of the SPO recovery unit 230 as being unsuccessful. This will be described below in more detail with reference to FIGS. 13 through 15.

FIG. 13 is a table showing pattern data which are stored in sectors, according to another embodiment of the inventive concepts. FIG. 14 is a table showing pattern data which are detected when an SPO recovery operation is unsuccessful, according to another embodiment of the inventive concept. FIG. 15 is a graph showing pattern data which are detected if an SPO recovery operation is unsuccessful, according to another embodiment of the inventive concept. Herein, the abscissa axis indicates each sector, and the ordinate axis indicates pattern data which are stored in respective sectors.

For conciseness, it may be assumed that pattern data may have positive integer values. It may be assumed that generated patterns are sequentially stored in first to eighth sectors S1 to S8. Moreover, it may be assumed that SPO occurs while pattern data '9' is being written in the sixth sector S6. It may be assumed that SPO occurs while pattern data '8' is being written in the fourth sector S4.

Referring to FIG. 3, first, it is assumed that pattern data '10' is sequentially stored in first to eighth sectors S1 to S8. Subsequently, pattern data '9' is sequentially overwritten in the first to eighth sectors S1 to S8.

Exemplarily, SPO may occur while the pattern data '9' is being written in the sixth sector S6. In this example embodiment, the SPO recovery unit 230 performs a SPO recovery operation, and the SPO recovery test unit 110 verifies whether the SPO recovery operation is successful. This has been described above with reference to FIGS. 10 through 12, and thus its detailed description will be omitted. In this example embodiment, it is assumed that the SPO recovery operation of the SPO recovery unit 230 is successively performed.

If a SPO recovery operation is successively performed while the pattern data '9' is being written, pattern data '8' is again and sequentially written in the first to eighth sectors S1 to S8. Referring to FIG. 13, exemplarily, it may be assumed that SPO occurs while the pattern data '8' is being written in the fourth sector S4.

In this example embodiment, if the power supply source is resupplied to the memory device 200, the SPO recovery unit 230 performs the SPO recovery operation. The SPO recovery test unit 110 determines whether the Operational state of the SP recovery unit 230 is successful based on the pattern data that is stored in the first to eighth sectors S1 to S8.

If the SPO recovery operation is unsuccessful, pattern data stored in the sector of a higher sector number is less than pattern data that is stored in the sector of a lower sector number. Referring to FIGS. 14 and 15, for example, the pattern data '9' is stored in the fifth sector S5, and the pattern data '10' is stored in the fourth sector S4.

In this example embodiment, the SPO recovery test unit 110 determines the operational state of the SPO recovery unit 230 as being unsuccessful. This may be because pattern data stored in the fifth sector S5 is less than pattern data that is stored in the fourth sector S4. As an example, the SPO recovery test unit 110 determines the operational state of the SPO recovery unit 230 as being unsuccessful even if it is impossible to analyze pattern data that are in a memory sector. As another example, the SPO recovery test unit 110 determines the operational state of the SPO recovery unit 230 as being unsuccessful even if data stored in the memory sector are initialized. This is similar to the described in FIGS. 4 and 6, and thus its detailed description will be omitted.

Figure 16:
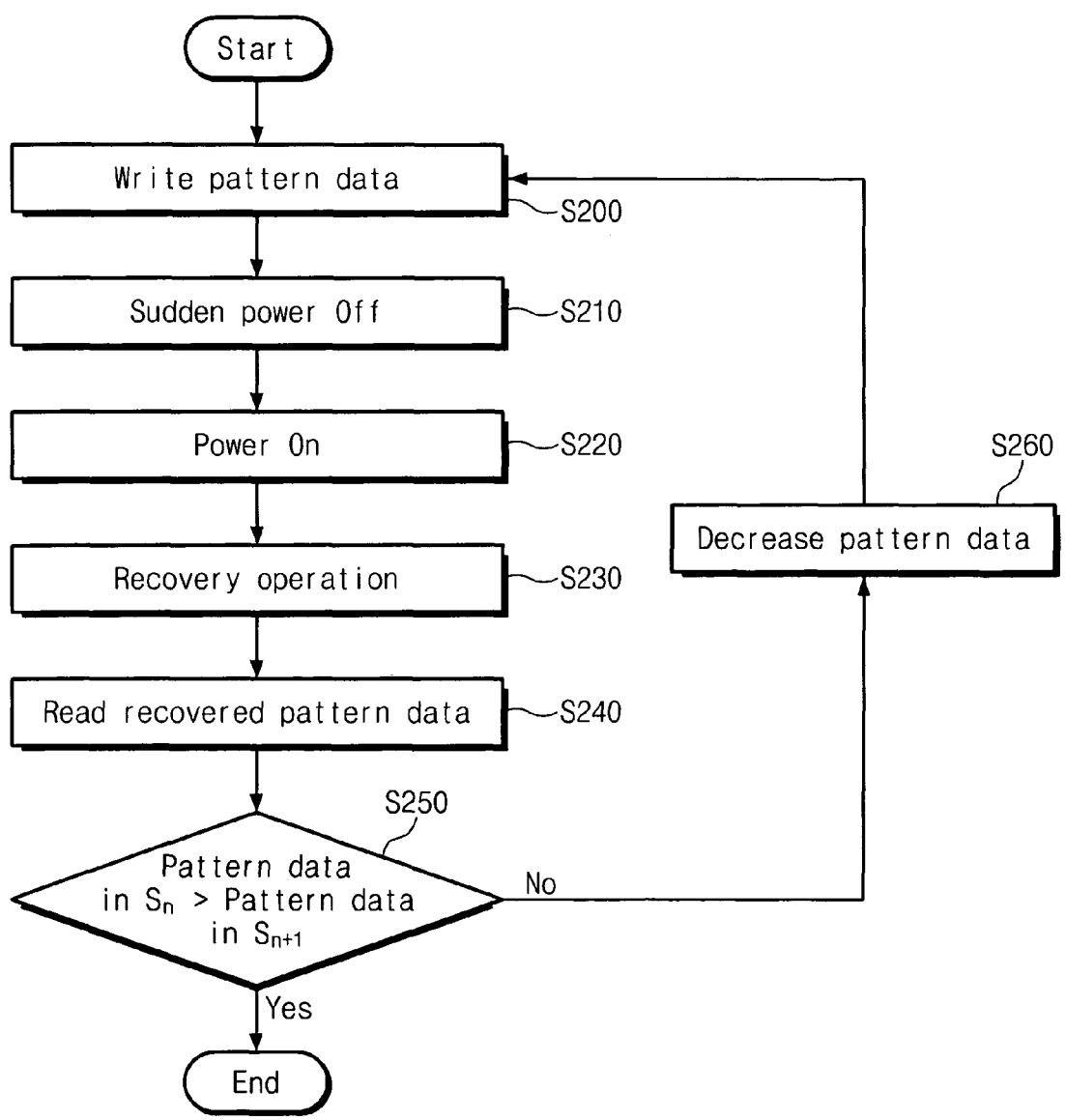
FIG. 16 is a flow chart illustrating a method for verifying the SPO recovery operation of an SPO recovery unit in FIGS. 10 through 15.

FIG. 16 is a flow chart illustrating a method for verifying the SPO recovery operation in FIGS. 10 through 15.

A method for verifying the SPO recovery operation in FIG. 16 is similar to a method for verifying the SPO recovery operation in FIG. 9. In FIG. 6, therefore, differences with respect to the method for verifying the SPO recovery operation in FIG. 9 will be mainly described below.

In operation S200, an operation is performed for writing pattern data in sectors. This is similar to operation S100 in FIG. 9, and thus its detailed description will be omitted. Referring to FIG. 10, exemplarily, pattern data '10' is first written in a first to an eighth sector S1 to S8. Then, pattern data '9' is written in the first to the eighth sectors S1 to S8.

In operation S210, SPO occurs. This is similar to operation S100 in FIG. 5, and thus its detailed description will be omitted. Referring to FIG. 6, SPO occurs while the pattern data '9' is being written in the sixth sector S6.

In operation S220, the power supply source is resupplied. In operation S230, the SPO recovery operation is performed. In operation S240, the SPO recovery test unit 110 reads recovered pattern data. These are somewhat similar to operations S120 to S140 in FIG. 9, and thus their detailed description will be omitted. Referring to FIGS. 10 through 12, the SPO recovery unit 230 deletes pattern data that is wrongfully stored in the sixth sector S6 due to SPO. The SPO recovery unit 230 recovers the pattern data '10' that was previously stored.

In operation S250, if pattern data stored in the sector of a higher sector number is less than pattern data that is stored in the sector of a lower sector number is determined. In other words, if the pattern data stored in the sector of the higher sector number is greater or less than the pattern data that is stored in the sector of the lower sector number is determined.

If the pattern data stored in the sector of a higher sector number is less than the pattern data that is stored in the sector of a lower sector number, the operational state of the SPO recovery unit 230 is determined as being unsuccessful. Referring to FIG. 7, for example, the pattern data stored in the fifth sector S5 is less than pattern data that is stored in the fourth sector S4, the operational state of the SPO recovery unit 230 is determined as being unsuccessful. As another example embodiment, the SPO recovery test unit 110 determines operational state of the SPO recovery unit 230 as being unsuccessful even if it is impossible to analyze pattern data that are in a memory sector. As another example embodiment, the SPO recovery test unit 110 determines the operational state of the SPO recovery unit 230 as being unsuccessful even if data stored in the memory sector are initialized.

If the pattern data stored in the sector of a higher sector number is equal to or greater than the pattern data that is stored in the sector of a lower sector number, the operational state of the SPO recovery unit 230 is determined as being successful. Referring to FIG. 6, for example, since pattern data stored in the sixth sector S6 is greater than pattern data that is stored in the fifth sector S5, the operational state of the SPO recovery unit 230 is determined as being successful.

If the operational state of the SPO recovery unit 230 is determined as being successful, pattern data decrease in operation S260. Subsequently, for the decreased pattern data, the above-described verification operation is repeated by a certain number of times.

For improving the reliability of the SPO recovery test unit 110 according to an example embodiment of the inventive concepts, pattern data should stably be stored in each sector. A method for stably storing pattern data in each sector will be described below with reference to FIGS. 17 and 18.

Figures 17, 18:
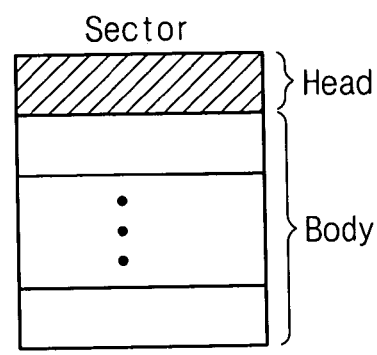
FIG. 17 is a diagram illustrating the structure of each sector according to an example embodiment of the inventive concepts.
FIG. 18 is a diagram illustrating an example in which pattern data according to an embodiment of the inventive concepts are may be stored.

FIGS. 17 and 18 are diagrams illustrating a method for storing pattern data in each sector, according to an example embodiment of the inventive concepts.

Exemplarily, it may be assumed that each memory sector has a 512-byte capacity. Moreover, it may be assumed that each memory sector includes 128 blocks having a 4-byte capacity.

Referring to FIG. 17, a sector includes a head and a body. In an example embodiment of the inventive concepts, the sum of a sector number and a pattern number is stored in the head of the sector. Moreover, a sector number, a pattern number and a body block number are stored in the blocks of the body of the sector, respectively.

Referring to FIG. 18, an example embodiment in which pattern data '1' is stored in first to eighth sectors S1 to S8 is illustrated. For example, data '2' which is the sum of a sector number '1' and a pattern number '1' is stored in the head of the first sector S1. Data '3' which is the sum of a sector number '1', a pattern number '1' and a body block number '1' is stored the first body block of the first sector S1.

Likewise, data '3 to 129' are stored in second to 127th body blocks, respectively. Moreover, data '3' which is the sum of a sector number '2' and a pattern number '1' is stored in the head of the second sector S2. Sequentially increasing data '4 to 130' are stored in the body blocks of the second sector S2.

Through the above-described method, different data are respectively stored in the heads of respective sectors. Moreover, different data are stored in the heads of respective sectors that are disposed at the same location. Thus, pattern data may more stably be stored in respective sectors.

For example, it may be assumed that an error occurs while pattern data is being written in the head of the first sector S1. Referring to data that is stored in a body block, in this example embodiment, pattern data stored in the first sector S1 may be easily be seen. Exemplarily, it may be assumed that data '3' is Stored in the first block of the body of the first sector S1. In this example embodiment, data stored in the first block of the body of the first sector S1 is expressed as Equation (1) below.

$$\text{sector number '1'+pattern number '?'+body block number '1'=body block data '3'} \quad \text{Equation (1)}$$

To perform Equation (1), it can easily be seen that pattern data stored in the first sector S1 is '1'. According to the above-described method, although an error occurs in the heads of the first to eighth sectors S1 to S8, pattern data may be derived on the basis of data that are stored in body blocks. This denotes that pattern data may be more stably stored.

It can be understood that the above-described method for storing pattern data in each sector may be applied to example embodiments of the inventive concepts in FIGS. 3 through 16. This denotes that the reliability of the SPO recovery test unit 110 according to an embodiment of the inventive concepts is improved.

Figure 19:
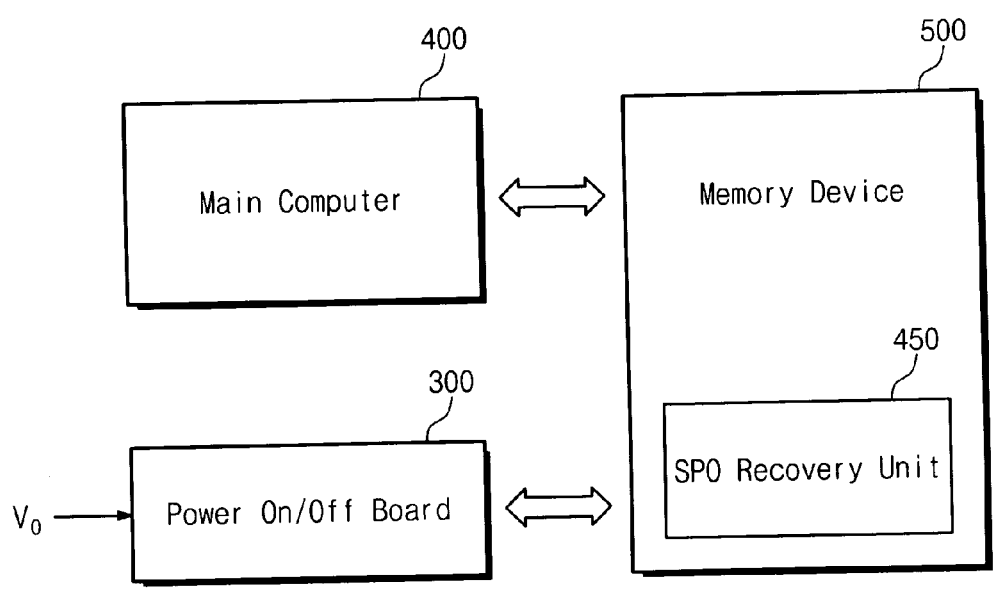
FIG. 19 is a block diagram illustrating a test system 20 according to another example embodiment of the inventive concepts.

FIG. 19 is a block diagram illustrating a test system 20 according to another example embodiment of the inventive concepts.

Referring to FIG. 19, a test system 20 according to another example embodiment of the inventive concepts includes a power on/off board 300, a main computer 400, and a memory device 500.

The power on/off board 300 controls a power supply source that supplies the power to the memory device 500. For example, the power on/off board 300 shuts off the power supply source, which is supplied from the outside to the memory device 500, to cause SPO. The power on/off board 300 resupplies the power supply source to the memory device 500 after SPO.

The main computer 400 controls a method for verifying the SPO recovery operation according to an example embodiment of the inventive concepts. For example, for causing SPO, the main computer 400 perform an operation such as the operation of the SPO recovery test unit 110 in FIG. 2 other than an operation for controlling the switch 113. For example, the main computer 400 may includes a personal computer (PC).

The SPO recovery unit 450 of the memory device 500 may be determined as a functioning product or a defective product according to the control of the power on/off board 300 and the main computer 400. The memory device 500 and the SPO recovery unit 450 have been described above in detail with reference to FIG. 1, and thus its detailed description will be omitted.

The performance test of the SPO recovery unit 450 according to an example embodiment of the inventive concepts may be performed independently of testing whether the memory cell of the memory device 500 is unsuccessful. That is, the test of the SPO recovery unit 450 according to an embodiment of the inventive concepts may be performed in the window environment of PC by using the power on/off board 300.

The test method and memory device according to embodiments of the inventive concepts may not require a space for storing data that are written before SPO. Accordingly, the test device may be implemented in a small area. Moreover, the test method and device for memory device according to embodiments of the inventive concepts may not compare recovered data and data that are written before SPO. Therefore, time taken in the verifying of the SPO recovery function is shortened.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A test method for a memory device including a plurality of storage regions and a Sudden Power Off (SPO) recovery unit, the test method comprising:
    storing data in the plurality of storage regions;
    shutting off supply of power to the memory device;
    resupplying the power to the memory device; and
    determining an operational state of the SPO recovery unit after the resupplying step based on the stored data.

2. The test method of claim 1, wherein the storing data step comprises:
    sequentially storing a first data in a first and a second storage region of the plurality of storage regions; and
    sequentially overwriting the first data with a second data in the first and the second storage regions of the plurality of storage regions.

3. The test method of claim 2, wherein the second data is greater than the first data.

4. The test method of claim 3, wherein the determining step determines the operational state of the SPO recovery unit is unsuccessful, if data stored in the second storage region is greater than data stored in the first Storage region.

5. The test method of claim 3, wherein the determining step determines the operational state of the SPO recovery unit is successful, if data stored in the second storage region is less than data stored in the first storage region.

6. The test method of claim 2, wherein the second data is less than the first data.

7. The test method of claim 6, wherein the determining step determines the operational state of the SPO recovery unit is unsuccessful, if data stored in the second storage region is less than data stored in the first storage region.

8. The test method of claim 6, wherein the determining step determines the operational state of the SPO recovery unit is successful, if data stored in the second storage region is less than data stored in the first storage region.

9. A test device for a memory device including a plurality of storage regions and a Sudden Power Off (SPO) recovery unit, the test device comprising:
    a data generator configured to generate data;
    a switch configured to selectively supply power to the memory device;
    a processor configured to store data in the plurality of storage regions, to control the switch to shut off supply of power to the memory device and to resupply the power to the memory device, and the processor configured to determine an operational state of the SPO recovery unit after the resupply of power based on the stored data.

10. The test device of claim 9, wherein the data generator is configured to generate a first data and a second data, wherein the first data is sequentially stored in a first and a second storage region of the plurality of storage regions, and the second data sequentially overwrites the first data in the first and the second storage regions.

11. The test device of claim 10, wherein the second data is greater than the first data.

12. The test device of claim 11, wherein the processor is configured to determine the operational state of the SPO recovery unit is unsuccessful, if data stored in the second storage region is greater than data stored in the first storage region.

13. The test device of claim 11, wherein the processor is configured to determine the operational state of the SPO recovery unit is successful, if data stored in the first storage region is less than data stored in the second storage region.

14. The test device of claim 10, wherein the second data is less than the first data.

15. The test device of claim 14, wherein the processor is configured to determine the operational state of the SPO recovery unit is unsuccessful, if data stored in the second storage region is less than data stored in the first storage region.

16. The test device of claim 14, wherein the processor is configured to determine the operational state of the SPO recovery unit is successful, if data stored in the first storage region is greater than data stored in the second storage region.

17. A test method for a memory device including a plurality of storage regions and a data recovery unit, the test method comprising:
    determining an operating state of the data recovery unit after a sudden power off of power supplied to the memory device based on data stored in the plurality of storage regions.

18. The test method of claim 17, wherein the determining step determines the operating state of the data recovery unit based on the data stored in the higher storage regions being greater than data stored in lower regions.

19. The test method of claim 17, wherein the determining step determines the operating state of the data recovery unit based on data stored in the higher storage regions being less than data stored in lower regions.

* * * * *